(12) United States Patent
Hirano

(10) Patent No.: US 9,280,067 B2
(45) Date of Patent: Mar. 8, 2016

(54) EXPOSURE APARATUS AND METHOD OF MANUFACTURING DEVICE TO AVOID COLLISION BETWEEN AN ELEVATING MEMBER OF A SUBSTRATE STAGE AND A CONVEYANCE ARM

(75) Inventor: Shinichi Hirano, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 639 days.

(21) Appl. No.: 12/940,681

(22) Filed: Nov. 5, 2010

(65) Prior Publication Data

US 2011/0116070 A1    May 19, 2011

(30) Foreign Application Priority Data

Nov. 16, 2009  (JP) ................................. 2009-261318
Oct. 22, 2010  (JP) ................................. 2010-237915

(51) Int. Cl.
*G03F 7/20*   (2006.01)
*H01L 21/677*  (2006.01)

(52) U.S. Cl.
CPC .......... *G03F 7/70775* (2013.01); *G03F 7/7075* (2013.01); *G03F 7/70725* (2013.01); *H01L 21/67748* (2013.01)

(58) Field of Classification Search
CPC .............. G03F 7/70725; G03F 7/7075; H01L 21/67748
USPC .................................. 355/72, 77, 73–76, 53
See application file for complete search history.

(56) References Cited

FOREIGN PATENT DOCUMENTS

| JP | 2006-066636 A | 3/2006 |
|---|---|---|
| KR | 10-0280108 B | 3/2001 |

OTHER PUBLICATIONS

Korean Office Action issued in Korean counterpart application No. KR10-2010-0109121, dated Feb. 18, 2013.

*Primary Examiner* — Chia-How Michael Liu
(74) *Attorney, Agent, or Firm* — Rossi, Kimms & McDowell LLP

(57) ABSTRACT

An exposure apparatus comprises: a substrate stage movable from a first position to a second position; a conveyance arm movable from a third position to the second position; an elevating member transferring the substrate to the arm at the second position; and a controller. The controller judges whether the stage reaches a fourth position that shifts to a front side from the second position by a predetermined interval for avoiding a collision between the substrate and the arm and a collision between the elevating member and the substrate when the elevating operation ends. If the controller judges that the stage does not reach the fourth position, the controller controls the movements of the stage and the arm, and the elevation of the elevating member so that the arm starts to move toward the second position before the end of the elevating operation.

7 Claims, 8 Drawing Sheets

EXPOSURE APARATUS AND METHOD OF MANUFACTURING DEVICE TO AVOID COLLISION BETWEEN AN ELEVATING MEMBER OF A SUBSTRATE STAGE AND A CONVEYANCE ARM

BACKGROUND OF THE INVENTION

1. Field of the Invention

The present invention relates to an exposure apparatus and a method of manufacturing a device.

2. Description of the Related Art

For an exposure apparatus used in a semiconductor manufacturing process, three performances are considered of prime importance: the resolution as an index of micropatterning, the overlay accuracy indicating the alignment performance of each layer, and the throughput indicating the productivity. To improve the throughput, for example, the exposure energy per unit time is increased, the time taken for a substrate stage to move step by step across shots is shortened, the time taken to exchange and convey substrates is shortened, or the scanning time of a scanner is shortened.

To shorten the conveyance time upon substrate exchange with the goal of improving the throughput, an effective measure is to shorten the conveyance distance. Nevertheless, to attain high resolution and high overlay accuracy, the layout in an exposure apparatus must inevitably be determined so as to optimize the location of a projection optical system, an illumination system serving as a light source, a substrate stage, and a substrate position measurement unit. For this reason, it is extremely difficult to shorten the conveyance time by shortening the conveyance distance.

To shorten the conveyance time, upgrading of a driving motor of a conveyance arm has been proposed. However, the bulk of a driving motor increases upon upgrading the motor. This poses problems such as the motor not being locatable in a limited apparatus space, the amount of heat generation increasing with increased driving energy, and the increased risk of substrate fall as the conveyance velocity and acceleration rise.

To shorten the conveyance time, Japanese Patent Laid-Open No. 2006-66636 discloses a mechanism of almost simultaneously performing supply of an unexposed substrate to a substrate stage and recovery of an exposed substrate from the substrate stage using a loading arm and an unloading arm.

SUMMARY OF THE INVENTION

The present invention provides an exposure apparatus with its productivity improved by shortening the time taken to exchange substrates.

According to the present invention, there is provided an exposure apparatus which exposes a substrate, the apparatus comprising: a substrate stage which holds a substrate and can move along a first route from a first position on an X-Y plane defined in an X-Y-Z coordinate system to a second position on the X-Y plane; a conveyance arm which holds a substrate and can move along a second route from a third position on the X-Y plane to the second position; an elevating member which is located on the substrate stage and can move upward/downward in a Z-axis direction defined in the X-Y-Z coordinate system in order to transfer the substrate to the conveyance arm at the second position; and a controller, wherein letting a be a predetermined interval between the substrate stage and the conveyance arm in the X-Y plane, that is necessary to avoid a collision between the substrate held by the elevating member, an elevating operation of which is in progress, and the conveyance arm, and a collision between the elevating member, the elevating operation of which is in progress, and the substrate held by the conveyance arm, the controller judges whether the substrate stage that has started to move toward the second position reaches a fourth position that shifts to a front side from the second position by the predetermined interval a in the first route at a time point when the elevating operation of the elevating member, that has started in order to transfer the substrate to the conveyance arm, ends, and, if the controller judges that the substrate stage does not reach the fourth position, the controller controls the movement of the substrate stage, the elevation of the elevating member, and the movement of the conveyance arm so that the conveyance arm starts to move toward the second position before the end of the elevating operation of the elevating member.

Further features of the present invention will become apparent from the following description of exemplary embodiments with reference to the attached drawings.

Figure 4:
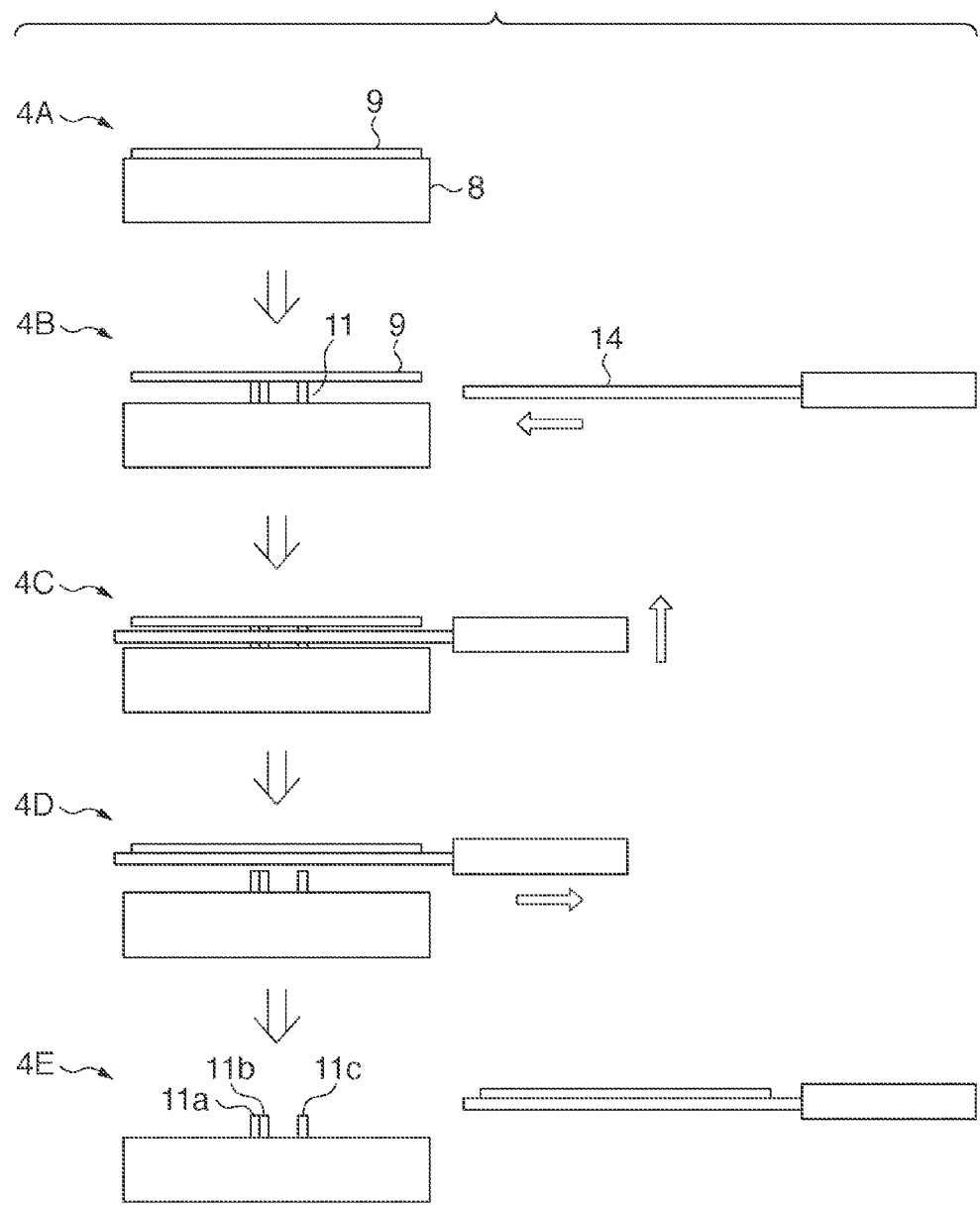
Figure 5:
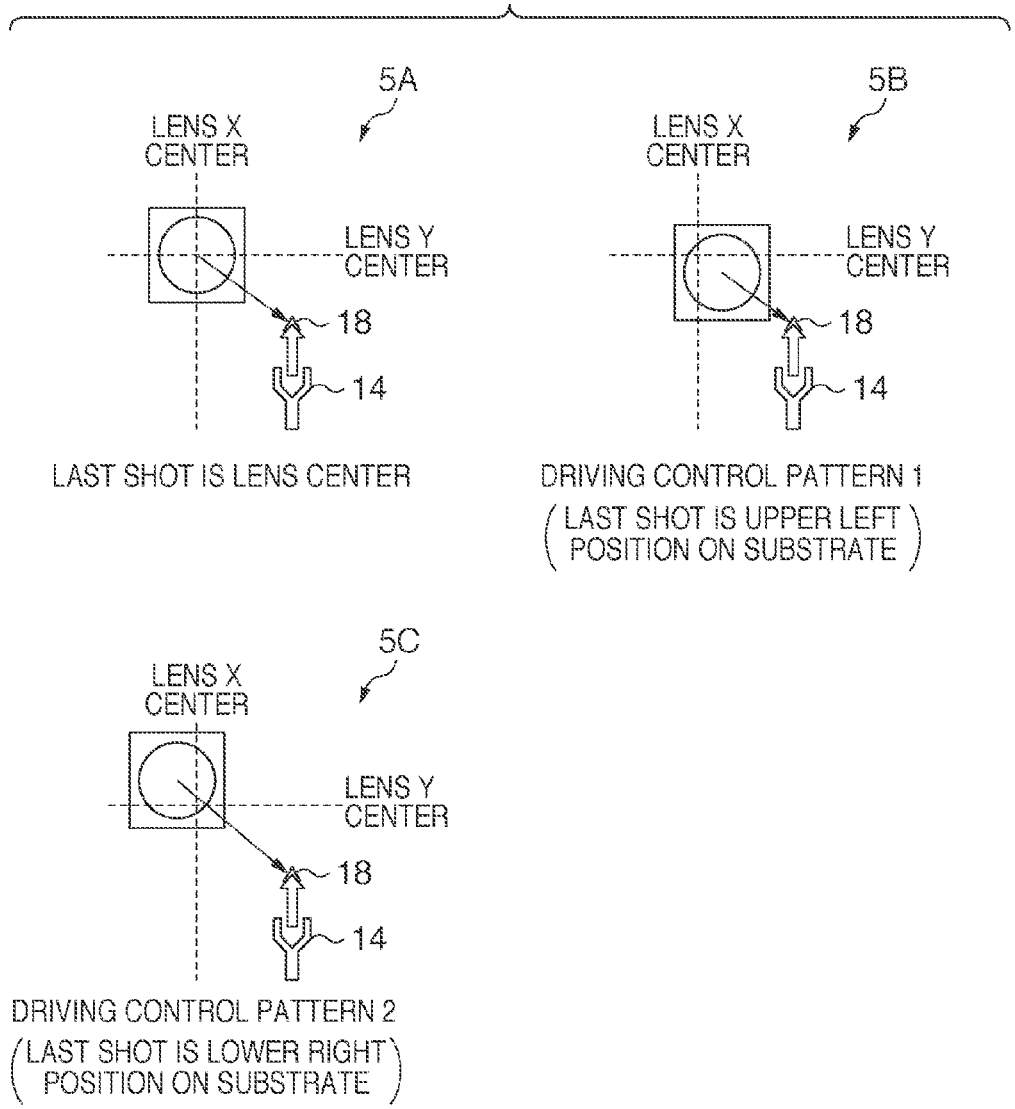
Figure 6:
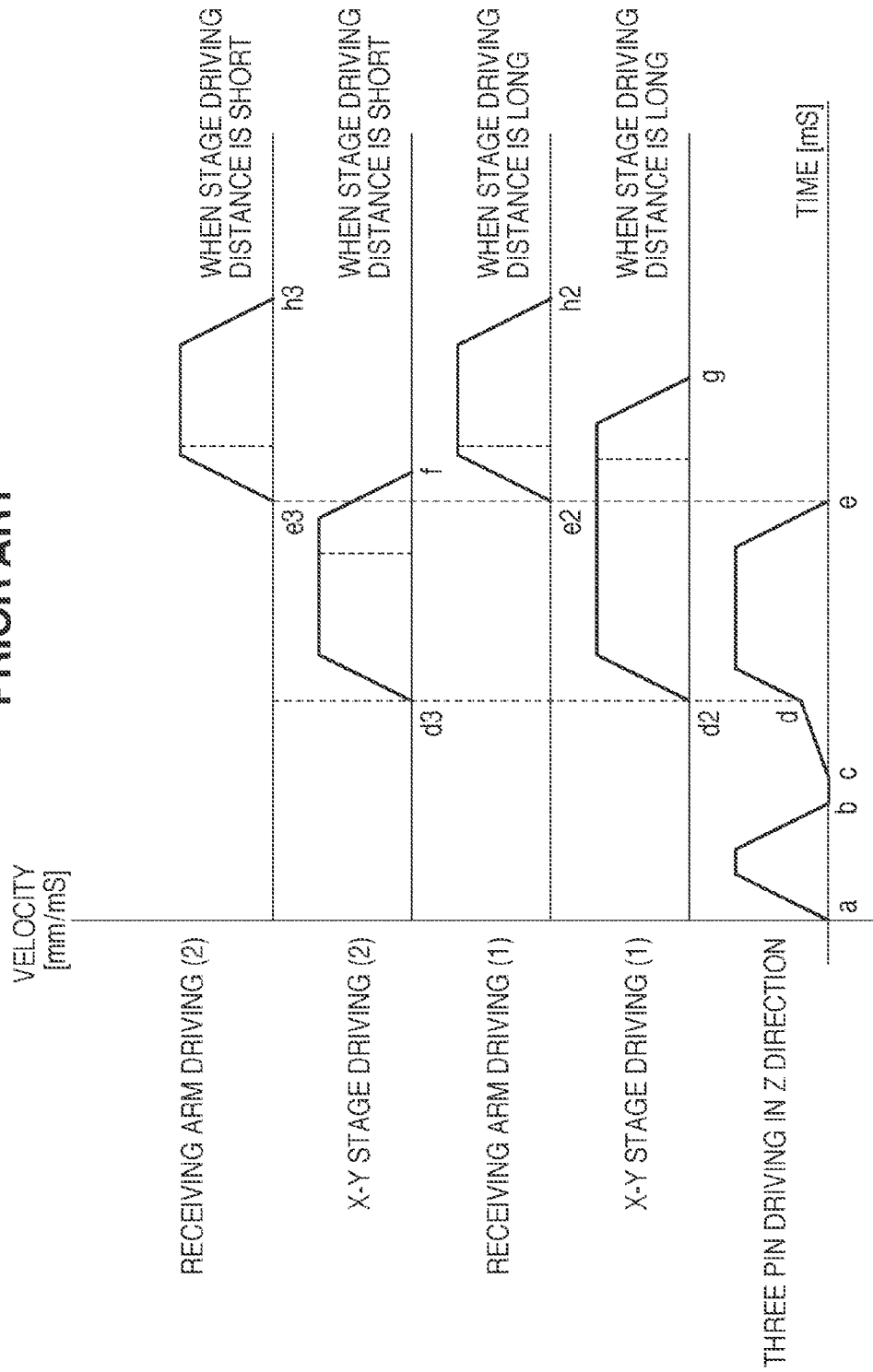
Figure 7:
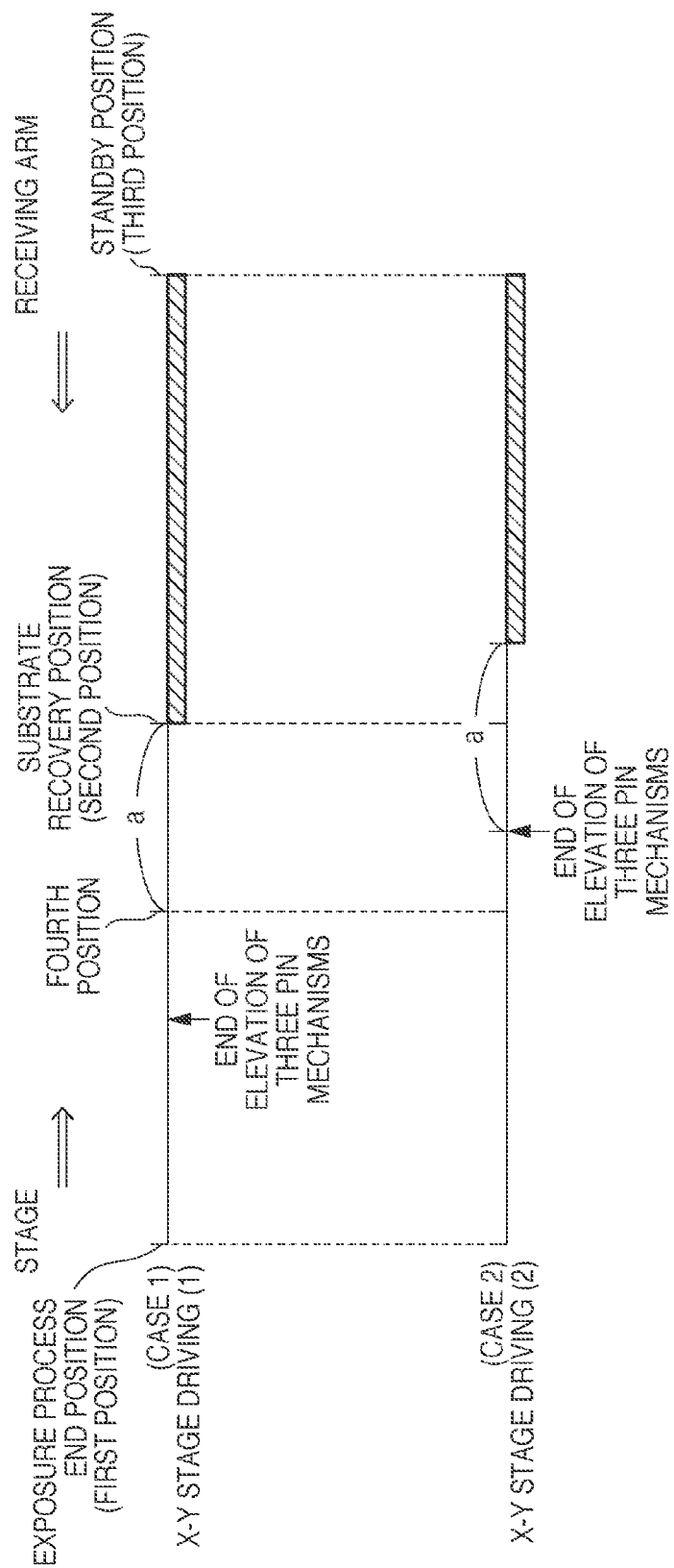
Figure 8:
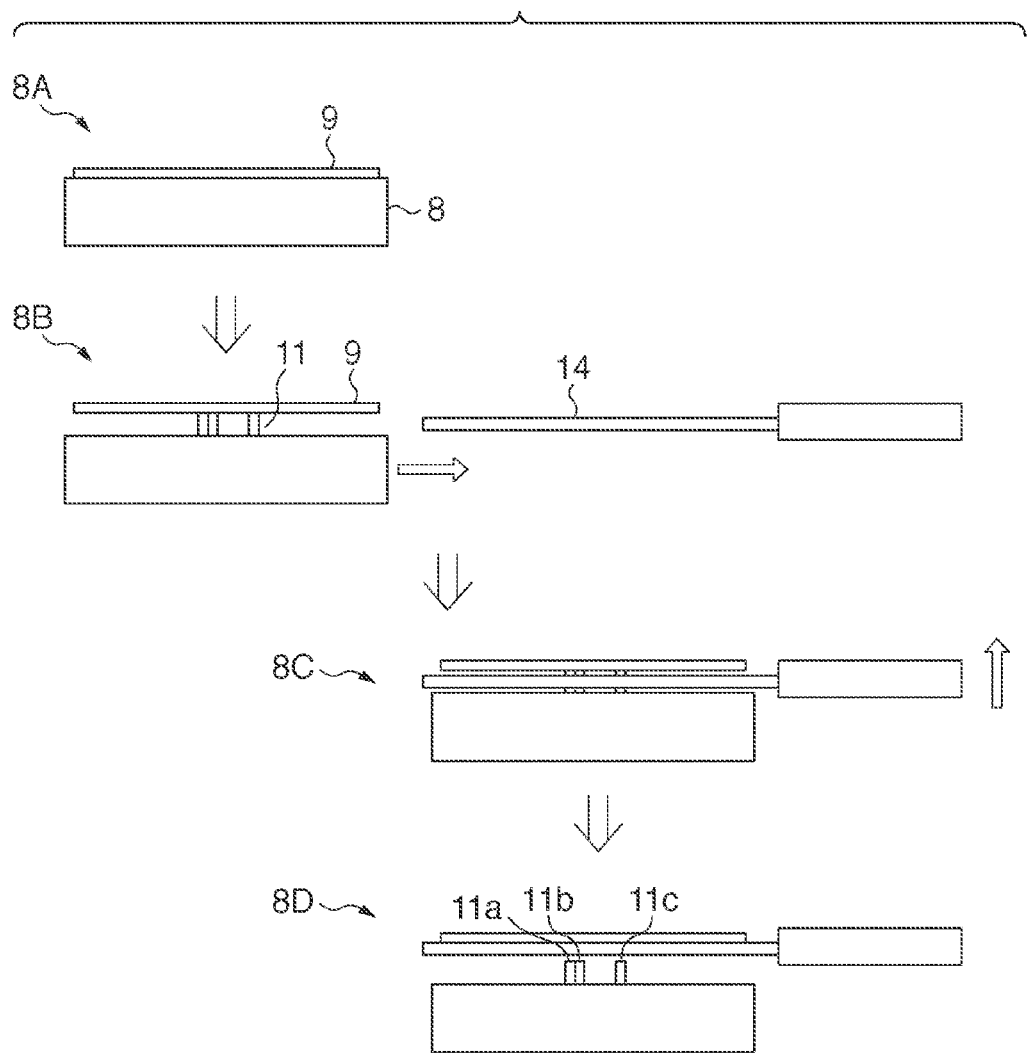

4A to 4E in FIG. 4 are schematic side views when a process in which a receiving arm receives a substrate from an X-Y stage is viewed laterally;

5A to 5C in FIG. 5 are schematic plan views when the process in which the receiving arm receives the substrate from the X-Y stage is viewed from above;

FIG. 6 is a schematic graph showing the operations of three pin mechanisms, the X-Y stage, and the receiving arm in the prior art;

FIG. 7 is a schematic view for explaining a method of receiving a substrate according to the present invention; and 8A to 8D in FIG. 8 are other schematic side views when the process in which the receiving arm receives the substrate from the X-Y stage is viewed laterally.

DESCRIPTION OF THE EMBODIMENTS

[Exposure Apparatus]

Figure 1:
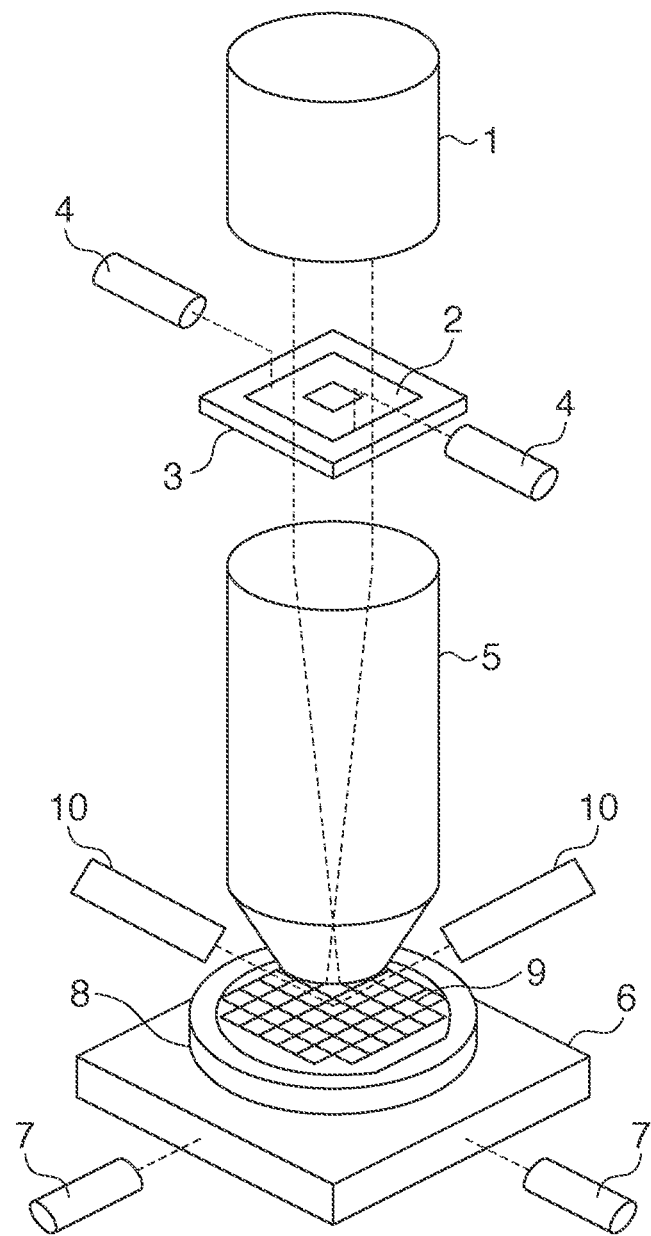
FIG. 1 is a perspective view for explaining an exposure apparatus.

An embodiment of an exposure apparatus will be described below with reference to the accompanying drawings. As shown in FIG. 1, an exposure apparatus which exposes a substrate includes an illumination system 1, a reticle stage 3, reticle position measurement devices 4, a projection optical system 5, a substrate stage, and auto focus units 10 which measure the focus positions of a substrate 9. The illumination system 1 includes a light source and shutter. The reticle stage 3 holds a reticle 2 on which a circuit pattern is drawn. The reticle position measurement devices 4 measure the positions of the reticle 2 on the reticle stage 3. The substrate stage includes an X-Y stage 6 which can move in two directions: the X and Y directions on an X-Y plane defined in an X-Y-Z coordinate system, and a Z driving mechanism (not shown) which can vertically move the substrate 9. A substrate chuck 8 is placed on a Z driving mechanism (not shown) for the substrate 9, and chucks and holds the substrate 9. Laser interferometers 7 measure the positions of the X-Y stage 6. The auto focus units 10 measure the focus positions of the substrate 9, and the Z driving mechanism (not shown) for the substrate 9 adjusts the focus of the substrate 9 in exposure, based on the obtained measurement results (this operation will be referred to as focusing hereinafter).

Figure 2:
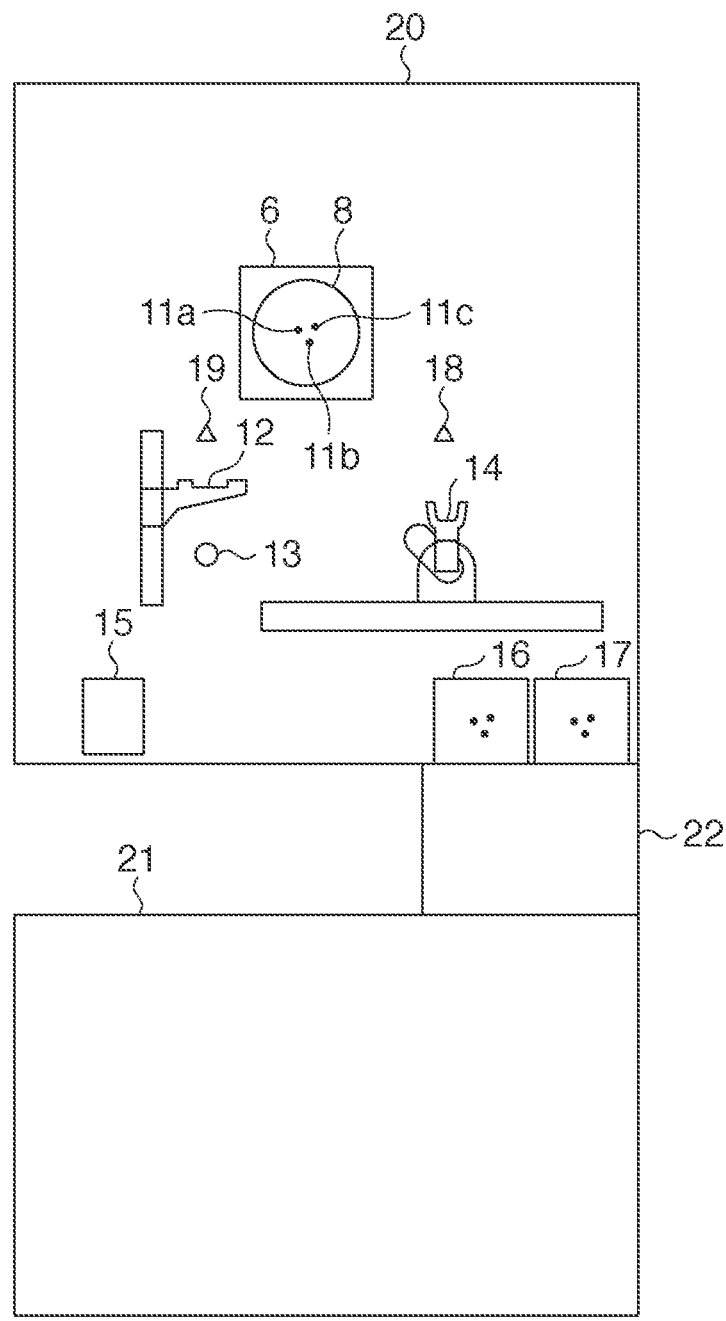
FIG. 2 is a schematic plan view for explaining the substrate conveyance route.

FIG. 2 is a schematic plan view, when viewed from the apparatus upper surface, for explaining the route along which the substrate 9 is conveyed when the exposure apparatus is operated upon being connected to an external apparatus in a semiconductor factory. The exposure apparatus is located in an exposure room 20 for maintaining the exposure environment at a predetermined temperature and humidity. Elevating members (three pin mechanisms) 11a to 11c which can move upward/downward in the Z-axis direction in order to transfer the substrate 9 are located on the X-Y stage 6.

The exposure apparatus includes a loading station 16 in which an unexposed substrate 9 is located, an unloading station 17 in which an exposed substrate 9 is located, a controller 15 which controls the exposure apparatus, and a prealignment unit 13 for aligning the substrate 9. The exposure apparatus also includes a receiving arm 14 and sending arm 12 which convey the substrate 9 in the exposure room 20. The receiving arm 14 conveys a loaded substrate 9 from the loading station 16 to the prealignment unit 13, and conveys an exposed substrate 9 located on the three pin mechanisms 11 to the unloading station 17. The sending arm 12 conveys a prealigned substrate 9 from the prealignment unit 13 to the three pin mechanisms 11. The sending arm 12 and the receiving arm 14 form a conveyance arm which holds the substrate 9 and transfers/receives it to/from the elevating members (three pin mechanisms) 11. Although the three pin mechanisms 11a, 11b, and 11c will be exemplified as the elevating members in this embodiment, the elevating members are not limited to such three pin mechanisms as long as they can move upward/downward and transfer/receive the substrate 9 to/from the conveyance arm.

Transfer of the substrate 9 will be described next. The sending arm 12 passes the substrate 9 to the three pin mechanisms 11, located on the X-Y stage 6, at a substrate supply position 19. The receiving arm 14 receives the substrate 9 from the three pin mechanisms 11, located on the X-Y stage 6, at a substrate recovery position 18. The substrate recovery position 18 and substrate supply position 19 are not marked with objects which have a shape as shown in FIG. 2 and are located at them in practice, and merely indicate specific positions on the movable plane (on the X-Y plane) of the X-Y stage 6. The substrate recovery position 18 and substrate supply position 19 can be changed while the exposure apparatus is in use based on, for example, an information on the operational status of the exposure apparatus or an information on processes for the exposure process. The exposure apparatus is connected to a FOUP transfer device 22 which transfers/receives the substrate 9 to/from an external apparatus and a FOUP (not shown) serving as a substrate carrier. The FOUP transfer device 22 is connected to a coating and developing apparatus 21 for coating an unexposed substrate 9 with a resist, and developing an exposed substrate 9. The controller 15 which controls the exposure apparatus may be a single computer or include a plurality of computers.

Figure 3:
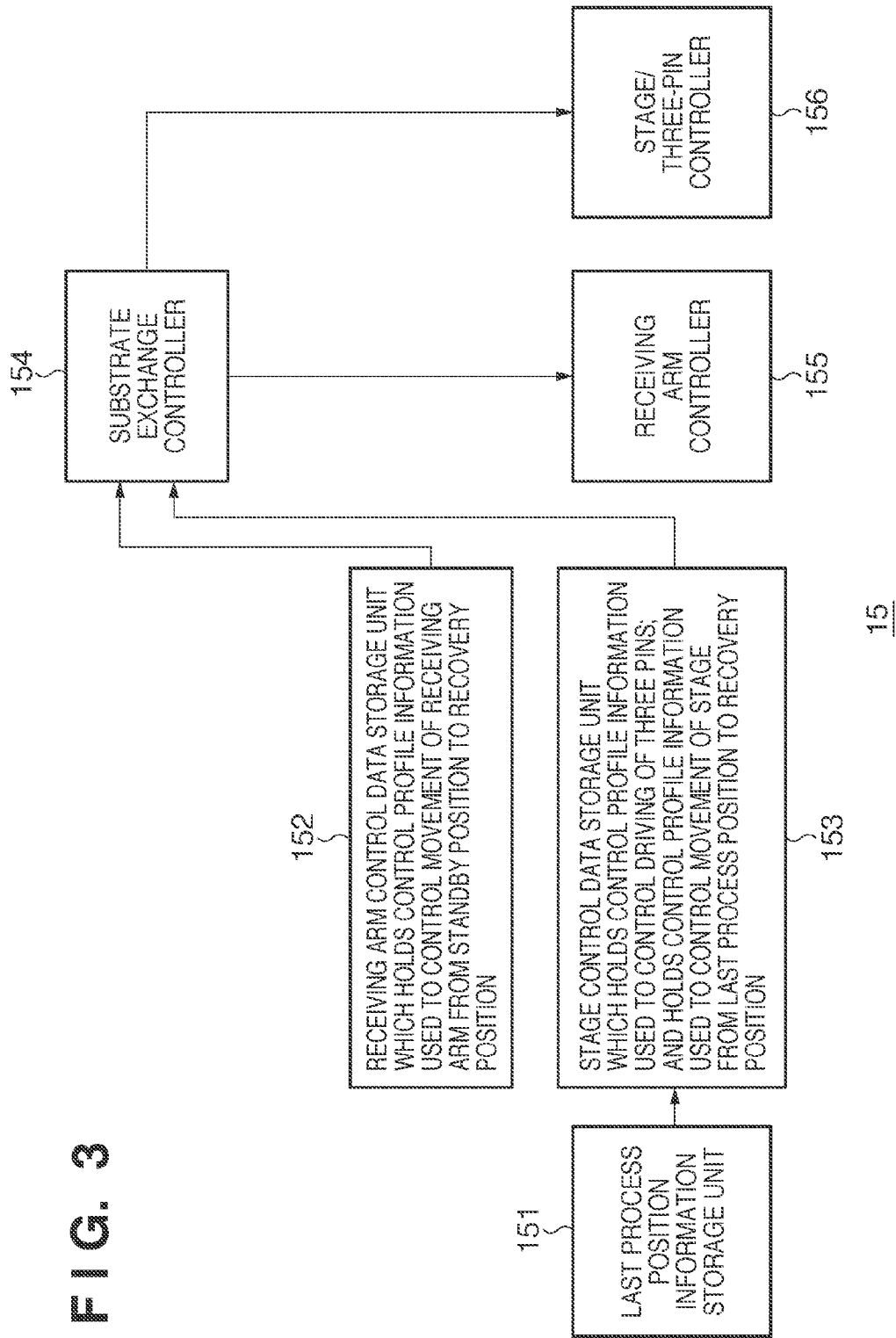
FIG. 3 is an explanatory block diagram of the internal configuration of a controller.

The internal configuration of the controller 15 will now be described with reference to FIG. 3. A last process position information storage unit 151 calculates the last process position information of the X-Y stage 6 when an exposure process on the substrate 9 ends, based on exposure layout information, and stores and holds it. If the last process on the substrate 9 is a measurement process, the last process position information storage unit 151 calculates the position where this measurement process is performed, and stores and holds it as a last process position. The last process position information storage unit 151 sends the held last process position information to a stage control data storage unit 153. A receiving arm control data storage unit 152 stores the control profile (velocity, acceleration, and duration) information of the receiving arm 14 when the receiving arm 14 moves from the standby position to the substrate recovery position 18 where it receives the substrate 9. The receiving arm control data storage unit 152 sends that information to a substrate exchange controller 154. The stage control data storage unit 153 stores the control profile information of the three pin mechanisms 11 when the three pin mechanisms 11a, 11b, and 11c are elevated in the Z direction in order to pass the substrate 9 to the receiving arm 14. The stage control data storage unit 153 also stores the horizontal control profile information of the X-Y stage 6 when the X-Y stage 6 moves from the last process position to the recovery position, where it passes the substrate 9 to the receiving arm 14, using the last process position information sent from the last process position information storage unit 151. The stage control data storage unit 153 sends the horizontal control profile information of the X-Y stage 6 and the control profile information of the three pin mechanisms 11 to the substrate exchange controller 154.

The substrate exchange controller 154 receives the control profile information of the receiving arm 14 from the receiving arm control data storage unit 152, and the pieces of control profile information of the X-Y stage 6 and three pin mechanisms 11 from the stage control data storage unit 153. Based on the received pieces of information, the substrate exchange controller 154 issues instructions to a receiving arm controller 155 and a stage/three-pin controller 156 so that the substrate exchange time is minimized without causing any collision between the three pin mechanisms 11 and the receiving arm 14. The receiving arm controller 155 controls the receiving arm 14 based on the instruction from the substrate exchange controller 154. The stage/three-pin controller 156 controls the X-Y stage 6 and the three pin mechanisms 11 based on the instruction from the substrate exchange controller 154.

4A to 4E in FIG. 4 are schematic side views showing in time sequence a process, in which the receiving arm 14 receives an exposed substrate 9 located on the substrate chuck 8 from the three pin mechanisms 11, when viewed laterally. Referring to 4A in FIG. 4, chucking of the exposed substrate 9 located on the substrate chuck 8 is canceled. Referring to 4B in FIG. 4, the three pin mechanisms 11 move upward and lift the substrate 9 to a position above the substrate chuck 8. Referring to 4C in FIG. 4, the receiving arm 14 enters between the substrate chuck 8 and the substrate 9. Referring to 4D in FIG. 4, the receiving arm 14 moves upward and obtains the substrate 9. Referring to 4E in FIG. 4, the receiving arm 14 takes away the obtained substrate 9.

5A to 5C in FIG. 5 are schematic plan views when the process in which the receiving arm 14 receives the exposed substrate 9 located on the substrate chuck 8 from the three pin mechanisms 11 is viewed from above. 5A in FIG. 5 shows a case in which the last exposure shot position is at the center of the substrate. 5B in FIG. 5 shows a case in which the last exposure shot position is an upper left position on the substrate. 5C in FIG. 5 shows a case in which the last exposure shot position is a lower right position on the substrate. The receiving arm 14 moves from the standby position to the substrate recovery position 18, where it prepares to receive the substrate. A bold solid arrow indicates the route along which the X-Y stage 6 moves toward the substrate recovery position 18 after an exposure process ends. Also, a bold hollow arrow indicates the route along which the receiving arm 14 moves toward the substrate recovery position 18. The position of the X-Y stage 6 at the last exposure shot position is a first position where the X-Y stage 6 starts to move in order to transfer the substrate 9 to the receiving arm 14, and the substrate recovery position 18 is a second position where the X-Y stage 6 transfers the substrate 9 to the receiving arm 14. Also, the moving route from the last exposure shot position to the substrate recovery position 18, which is indicated by the bold solid arrow, is a first route along which the X-Y stage 6 moves in order to transfer the substrate 9 to the receiving arm 14. The standby position of the receiving arm 14 is a third position where the receiving arm 14 starts to move in order to receive the substrate 9 from the three pin mechanisms 11 on the X-Y stage 6. Moreover, the moving path indicated by the bold hollow arrow is a second route along which the receiving arm 14 moves in order to receive the substrate 9.

Letting La be the moving distance of the X-Y stage 6 in case of 5A in FIG. 5, Lb be its moving distance in case of 5B in FIG. 5, and Lc be its moving distance in case of 5C in FIG. 5, Lc>La>Lb. Although the last process is an exposure process on the substrate 9 in all cases of 5A, 5B and 5C in FIG. 5, it may be a measurement process on a measurement reference mark (not shown) provided on the X-Y stage 6 or measurement process on a mark provided on the substrate 9, instead of an exposure process on the substrate 9.

FIG. 6 is a graph for explaining a control method according to the prior art when the substrate 9 is transferred from the substrate chuck 8 to the three pin mechanisms 11, and further transferred from the three pin mechanisms 11 to the receiving arm 14. FIG. 6 shows two types of driving profiles of the X-Y stage 6: "X-Y Stage Driving (1)" when the last exposure position is far from the substrate recovery position, as shown in 5C in FIG. 5; and "X-Y Stage Driving (2)" when the last exposure position is close to the substrate recovery position, as shown in 5B in FIG. 5. The X-Y stage 6 having undergone the last exposure process on the substrate performs a process of moving from the last shot exposure position to the substrate recovery position 18, and a process of driving the three pin mechanisms 11 upward (in the Z direction) and receiving the substrate 9 from the substrate chuck 8. The receiving arm 14 performs a process of moving from the standby position to the substrate recovery position 18. The three pin mechanisms 11 stand by inside the chuck at point a in FIG. 6, start their upward driving, and reach point b in the close vicinity of the substrate 9. At this time point, the three pin mechanisms 11 are not in contact with the substrate 9. The three pin mechanisms 11 gradually speed up from point c to point d, and receive the substrate 9 from the substrate chuck 8. From point d to point e, the three pin mechanisms 11 rapidly speed up, so the substrate 9 mounted on the three pin mechanisms 11 elevates up to the position where the receiving arm 14 can enter the gap between the substrate chuck 8 and the substrate 9.

The X-Y stage 6 starts its driving toward the substrate recovery position 18 from point d2 or d3 at which the three pin mechanisms 11 have received the substrate 9 from the substrate chuck 8. The driving profiles of the X-Y stage 6, which indicate the stage driving velocity, acceleration, and time, differ depending on whether the last exposure shot region is close to or far from the substrate recovery position 18. "X-Y Stage Driving (1)" shown in FIG. 6 corresponds to a case in which the last exposure shot region is far from the substrate recovery position 18, and "X-Y Stage Driving (2)" shown in FIG. 6 corresponds to a case in which the last exposure shot region is close to the substrate recovery position 18. In both cases, the receiving arm 14 starts its driving from point e2 or e3, at which the three pin mechanisms 11 have been driven to the degree that the receiving arm 14, the three pin mechanisms 11, and the substrate 9 become free of risk of their collision, and reaches the substrate recovery position 18 at point h2 or h3. This operation coincides with explanatory views shown in 4A to 4E in FIG. 4.

FIG. 7 is a view for explaining a control method which uses the technique according to the present invention to transfer the substrate 9 from the substrate chuck 8 to the receiving arm 14 via the three pin mechanisms 11. Let a be the predetermined interval (for example, a minimum interval) between the X-Y stage 6 and the receiving arm 14, that is necessary to avoid a collision between the substrate 9 held by the three pin mechanisms 11, the elevating operation of which is in progress, and the receiving arm 14, and a collision between the three pin mechanisms 11, the elevating operation of which is in progress, and the substrate 9 held by the receiving arm 14. The position where the X-Y stage 6 that has started to move toward the substrate recovery position (second position) 18 reaches, and which shifts to the front side from the substrate recovery position 18 by the predetermined interval a in the moving route is defined as a fourth position. The control procedures for the X-Y stage 6, three pin mechanisms 11, and receiving arm 14 are divided into two cases in accordance with whether the X-Y stage 6 has reached the fourth position at the time point when the elevating operation of the three pin mechanisms 11 ends. The substrate exchange controller 154 judges this case division based on the last process position information of the X-Y stage 6 when an exposure process has ended and the control profiles of the receiving arm 14, three pin mechanisms 11, and X-Y stage 6. The predetermined interval a can be set to a given value. However, the predetermined interval a may be changed in accordance with the routes along which the X-Y stage 6 enters the substrate recovery position 18 shown in 5A to 5C in FIG. 5, the location of the three pin mechanisms 11, and the shape of the receiving arm 14. Although the routes along which the X-Y stage 6 enters the substrate recovery position 18 are assumed to be linear in 5A to 5C in FIG. 5, they need not always be linear.

[Case 1: X-Y Stage 6 has not Reached Fourth Position at Time Point when Elevating Operation of Three Pin Mechanisms 11 Ends]

In case 1, the position where an exposure process ends as the moving start position of the X-Y stage 6 is far from the substrate recovery position 18, as shown in 5C in FIG. 5, and the elevating operation of the three pin mechanisms 11 ends before the X-Y stage 6 reaches the fourth position. In this case, neither a collision between the substrate 9 held by the three pin mechanisms 11, the elevating operation of which is in progress, and the receiving arm 14, nor a collision between the three pin mechanisms 11, the elevating operation of which is in progress, and the substrate 9 held by the receiving arm 14, should occur. That is, no collision occurs wherever the receiving arm 14 is positioned in its moving route, as indicated by a hatched portion in "X-Y Stage Driving (1)" shown in FIG. 7. Hence, since the receiving arm 14 can start to move independently of the moving operation of the X-Y stage 6 and the elevating operation of the three pin mechanisms 11, the receiving arm 14 can start to move before the end of the elevating operation of the three pin mechanisms 11, as in the prior art. In this case, the substrate exchange time can be further shortened when the receiving arm 14 reaches the substrate recovery position 18 simultaneously with or earlier than the X-Y stage 6.

[Case 2: X-Y Stage 6 has Reached Fourth Position at Time Point when Elevating Operation of Three Pin Mechanisms 11 Ends]

In case 2, the position where an exposure process ends as the moving start position of the X-Y stage 6 is close to the substrate recovery position 18, as shown in 5B in FIG. 5, and the elevating operation of the three pin mechanisms 11 ends after the X-Y stage 6 passes through the fourth position. In this case, if the receiving arm 14 has advanced to the substrate recovery position 18 too early, for example, the substrate 9 held by the three pin mechanisms 11 which have passed through the fourth position and the elevating operation of which is in progress, and the receiving arm 14, may collide with each other. However, if the receiving arm 14 is at a position that falls within a range indicated by a hatched portion in "X-Y Stage Driving (2)" shown in FIG. 7, for example, no collision between the substrate 9 held by the three pin mechanisms 11, the elevating operation of which is in progress, and the receiving arm 14, should occur. That is, the receiving arm 14 can advance to the position that falls within the range indicated by the hatched portion in "X-Y Stage Driving (2)" shown in FIG. 7 independently of the moving operation of the X-Y stage 6 and the elevating operation of the three pin mechanisms 11. Hence, in case 2 as well, there is no need to wait until the elevating operation of the three pin mechanisms 11 ends in order to start movement of the receiving arm 14, unlike the prior art. An effect of shortening the substrate exchange time is great when the interval between the X-Y stage 6 and the receiving arm 14 at the time point when the elevating operation of the three pin mechanisms 11 ends becomes slightly larger than the predetermined interval a. Here, "the time point when the elevating operation of the three pin mechanisms 11 ends" should not be limited to a time point when driving of the three pin mechanisms 11 is completely stopped. For example, "the time point when the elevating operation of the three pin mechanisms 11 ends" can be a time point when the elevating operation of the three pin mechanisms 11 proceeds to a status wherein the receiving arm 14 does not physically interfere with the three pin mechanisms 11 and the substrate 9.

8A to 8D in FIG. 8 are schematic side views showing in time sequence a process, in which the receiving arm 14 receives an exposed substrate 9 located on the substrate chuck 8 from the three pin mechanisms 11 in case 1 shown in FIG. 7, when viewed laterally. Referring to 8A in FIG. 8, chucking of the exposed substrate 9 located on the substrate chuck 8 is canceled. Referring to 8B in FIG. 8, the three pin mechanisms 11 move upward and lift the substrate 9 to a position above the substrate chuck 8. At the same time, the receiving arm 14 moves from the standby position to the substrate recovery position 18. Referring to 8C in FIG. 8, the X-Y stage 6 completes its movement toward the receiving arm 14 which is standing by at the substrate recovery position 18. Referring to 8D in FIG. 8, the receiving arm 14 moves upward and obtains the substrate 9.

The present invention has been described above using an operation in which the receiving arm 14 receives the substrate 9 from the X-Y stage 6. However, the above-mentioned method can be used even in an operation in which the sending arm 12 transfers the substrate 9 to the X-Y stage 6, as a matter of course.

As has been described above, according to the present invention, the productivity of a semiconductor manufacturing apparatus can be improved without changing the layout in an exposure apparatus or raising the driving velocity of a substrate stage or a conveyance arm.

[Method of Manufacturing Device]

A method of manufacturing a device using the above-mentioned exposure apparatus will be described next. In this case, a device is manufactured by a step of exposing a substrate using the above-mentioned exposure apparatus, a step of developing the exposed substrate, and subsequent known steps. The device can be, for example, a semiconductor integrated circuit device or a liquid crystal display device. The substrate can be, for example, a wafer or a glass plate. The known steps include, for example, oxidation, film formation, vapor deposition, doping, planarization, dicing, bonding, and packaging steps.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-261318, filed Nov. 16, 2009, and No. 2010-237915, filed Oct. 22, 2010, which are hereby incorporated by reference herein in their entirety.

What is claimed is:

1. An exposure apparatus which exposes a substrate, the apparatus comprising:
   a light source for exposing the substrate;
   a substrate stage which holds the substrate using a substrate chuck and is movable along a first route from a substrate processing termination position on an X-Y plane defined in an X-Y-Z coordinate system to a substrate recovery position on the X-Y plane;
   a conveyance arm which holds the substrate and is movable along a second route from a waiting position on the X-Y plane to the substrate recovery position;
   an elevating member located on said substrate stage and is movable upward/downward relative to the substrate chuck in a Z-axis direction defined in the X-Y-Z coordinate system to transfer the substrate to said conveyance arm at the substrate recovery position; and
   a controller configured to control movement of said substrate stage, elevating operation of said elevating member, and movement of said conveyance arm,
   wherein said controller controls the elevating operation of said elevating member so that the elevating member moves upward relative to the substrate chuck in the Z direction while said substrate stage moves from the substrate processing termination position to the substrate recovery position, and
   wherein said controller, letting "a" be a predetermined interval between said substrate stage and said conveyance arm in the X-Y plane, that is necessary to avoid a collision between the substrate held by said elevating member, the elevating operation in progress, and said conveyance arm, and a collision between said elevating member, the elevating operation of which is in progress, and the substrate held by said conveyance arm:
   judges whether said substrate stage that has started to move toward the substrate recovery position reaches, at a time point of an ending of the elevating operation of said elevating member that has started to transfer the substrate to said conveyance arm, a judging position that shifts to a front side from the substrate recovery position by the predetermined interval in the first route;
   when said controller judges that said substrate stage does not reach, at the time point of the ending of the elevating operation of said elevating member that has started to transfer the substrate to said conveyance arm, the judging position, controls the movement of said substrate stage, the elevating operation of said elevating member, and the movement of said conveyance arm so that said conveyance arm starts to move toward the substrate recovery position before the end of the elevating operation of said elevating member; and when said controller judges that said substrate stage reaches the judging position, controls the movement of said substrate stage, the elevating operation of said elevating member, and the movement of said conveyance arm so that said conveyance arm starts to move toward the substrate recovery position in response to the ending of the elevating operation of said elevating member.

2. The apparatus according to claim 1, wherein when said controller judges that said substrate stage does not reach the judging position, said controller controls the movement of said substrate stage, the elevating operation of said elevating member, and the movement of said conveyance arm so that said conveyance arm reaches the substrate recovery position simultaneously with or earlier than said substrate stage.

3. The apparatus according to claim 1, wherein the substrate processing termination position is a position of said substrate stage when an exposure process on the substrate held by said substrate stage or a measurement process on the substrate has ended.

4. A method of manufacturing a device, the method comprising:
an exposing step of exposing a substrate using an exposure apparatus;
a developing step of developing the exposed substrate; and
a processing step of processing the developed substrate to manufacture the device,
wherein the exposure apparatus includes:
a light source for exposing the substrate;
a substrate stage which holds the substrate using a substrate chuck and is movable along a first route from a substrate processing termination position on an X-Y plane defined in an X-Y-Z coordinate system to a substrate recovery position on the X-Y plane;
a conveyance arm which holds the substrate and is movable along a second route from a waiting position on the X-Y plane to the substrate recovery position;
an elevating member located on the substrate stage and is movable upward/downward relative to the substrate chuck in a Z-axis direction defined in the X-Y-Z coordinate system to transfer the substrate to the conveyance arm at the substrate recovery position; and
a controller configured to control movement of said substrate stage, elevating operation of said elevating member, and movement of said conveyance arm,
wherein said controller controls the elevating operation of said elevating member so that the elevating member moves upward relative to the substrate chuck in the Z direction while said substrate stage moves from the substrate processing termination position to the substrate recovery position, and
wherein said controller, letting "a" be an interval between the substrate stage and the conveyance arm in the X-Y plane, that is necessary to avoid a collision between the substrate held by the elevating member, the elevating operation in progress, and the conveyance arm, and a collision between the elevating member, the elevating operation in progress, and the substrate held by the conveyance arm:
judges whether the substrate stage that has started to move toward the substrate recovery position reaches, at a time point of an ending of the elevating operation of said elevating member that has started to transfer the substrate to said conveyance arm, a judging position that shifts to a front side from the substrate recovery position by the predetermined interval in the first route;
when said controller judges that said substrate stage does not reach, at the time point of the ending of the elevating operation of said elevating member that has started to transfer the substrate to said conveyance arm, the judging position, controls the movement of said substrate stage, the elevating operation of said elevating member, and the movement of said conveyance arm so that said conveyance arm starts to move toward the substrate recovery position before the end of the elevating operation of said elevating member; and
when said controller judges that said substrate stage reaches the judging position, controls the movement of said substrate stage, the elevating operation of said elevating member, and the movement of said conveyance arm so that said conveyance arm starts to move toward the substrate recovery position in response to the ending of the elevating operation of said elevating member.

5. An exposure apparatus which exposes a substrate, the apparatus comprising:
a light source for exposing the substrate;
a substrate stage which holds the substrate using a substrate chuck and is movable along a first route from a substrate processing termination position on an X-Y plane defined in an X-Y-Z coordinate system to a substrate recovery position on the X-Y plane;
a conveyance arm which holds the substrate and is movable along a second route from a waiting position on the X-Y plane to the substrate recovery position;
an elevating member located on said substrate stage and is movable upward/downward relative to the substrate chuck in a Z-axis direction defined in the X-Y-Z coordinate system to transfer the substrate to said conveyance arm at the substrate recovery position; and
a controller configured to control movement of said substrate stage, elevating operation of said elevating member, and movement of said conveyance arm,
wherein said controller controls the elevating operation of said elevating member so that the elevating member moves upward relative to the substrate chuck in the Z direction while said substrate stage moves from the substrate processing termination position to the substrate recovery position, and
wherein said controller obtains information on the substrate processing termination position and switches between a first mode where said conveyance arm starts to move before an ending of the elevating operation of said elevating member and a second mode where said conveyance arm starts to move in response to the ending of the elevating operation of said elevating member based on the obtained information on the substrate processing termination position.

6. A conveyance apparatus which conveys a substrate, the apparatus comprising:
a substrate stage which holds the substrate using a substrate chuck and is movable along a first route from a substrate processing termination position on an X-Y plane defined in an X-Y-Z coordinate system to a substrate recovery position on the X-Y plane;
a conveyance arm which holds the substrate and is movable along a second route from a waiting position on the X-Y plane to the substrate recovery position;
an elevating member located on said substrate stage and is movable upward/downward relative to the substrate chuck in a Z-axis direction defined in the X-Y-Z coordinate system to transfer the substrate to said conveyance arm at the substrate recovery position; and a controller configured to control movement of said substrate stage, elevating operation of said elevating member, and movement of said conveyance, wherein said controller controls the elevating operation of said elevating member so that the elevating member moves upward relative to the substrate chuck in the Z direction while said substrate stage moves from the substrate processing termination position to the substrate recovery position, and wherein said controller, letting "a" be a predetermined interval between said substrate stage and said conveyance arm in the X-Y plane, that is necessary to avoid a collision between the substrate held by said elevating member, the elevating operation in progress, and said conveyance arm, and a collision between said elevating member, the elevating operation in progress, and the substrate held by said conveyance arm:

judges whether said substrate stage that has started to move toward the substrate recovery position reaches, at a time point of an ending of the elevating operation of said elevating member that has started to transfer the substrate to said conveyance arm, a judging position that shifts to a front side from the substrate recovery position by the predetermined interval in the first route;

when said controller judges that said substrate stage does not reach, at the time point of the ending of the elevating operation of said elevating member that has started to transfer the substrate to said conveyance arm, the judging position, controls the movement of said substrate stage, the elevating operation of said elevating member, and the movement of said conveyance arm so that said conveyance arm starts to move toward the substrate recovery position before the end of the elevating operation of said elevating member; and when said controller judges that said substrate stage reaches the judging position, controls the movement of said substrate stage, the elevating operation of said elevating member, and the movement of said conveyance arm so that said conveyance arm starts to move toward the substrate recovery position in response to the ending of the elevating operation of said elevating member.

7. A conveyance apparatus which conveys a substrate, the apparatus comprising:

a substrate stage which holds the substrate using a substrate chuck and is movable along a first route from a substrate processing termination position on an X-Y plane defined in an X-Y-Z coordinate system to a substrate recovery position on the X-Y plane;

a conveyance arm which holds the substrate and is movable along a second route from a waiting position on the X-Y plane to the substrate recovery position;

an elevating member located on said substrate stage and is movable upward/downward relative to the substrate chuck in a Z-axis direction defined in the X-Y-Z coordinate system to transfer the substrate to said conveyance arm at the substrate recovery position; and a controller configured to control movement of said substrate stage, elevating operation of said elevating member, and movement of said conveyance arm, wherein said controller controls the elevating operation of said elevating member so that the elevating member moves upward relative to the substrate chuck in the Z direction while said substrate stage moves from the substrate processing termination position to the substrate recovery position, and wherein said controller obtains information on the substrate processing termination position and switches between a first mode where said conveyance arm starts to move before an ending of the elevating operation of said elevating member and a second mode where said conveyance arm starts to move in response to the ending of the elevating operation of said elevating member based on the obtained information on the substrate processing termination position.

* * * * *